United States Patent
Harris et al.

(10) Patent No.: US 9,954,706 B1
(45) Date of Patent: Apr. 24, 2018

(54) OUTPHASED SPATIAL COMBINER

(71) Applicant: L3 Technologies Inc.

(72) Inventors: Johnny M. Harris, Layton, UT (US);
Kyle D. Holzer, Bountiful, UT (US);
Janez Jeraj, Farmington, UT (US)

(73) Assignee: L3 Technologies Inc., New York, NY (US)

( * ) Notice: Subject to any disclaimer, the term of this patent is extended or adjusted under 35 U.S.C. 154(b) by 0 days.

(21) Appl. No.: 15/337,729

(22) Filed: Oct. 28, 2016

(51) Int. Cl.
*H04B 1/02* (2006.01)
*H04L 27/26* (2006.01)
*H03F 3/19* (2006.01)
*H03F 3/21* (2006.01)

(52) U.S. Cl.
CPC ........... *H04L 27/2621* (2013.01); *H03F 3/19* (2013.01); *H03F 3/211* (2013.01); *H03F 2200/102* (2013.01); *H03F 2200/451* (2013.01)

(58) Field of Classification Search
CPC ............. H04L 27/2614; H04L 27/2615; H04L 27/2618; H04L 27/2621; H04L 27/2626; H04L 27/367; H04L 27/368; H04B 2001/0425; H04B 2001/0433; H04B 2001/045; H04B 1/62; H03F 3/19; H03F 3/211; H03F 2200/451; H03F 2200/102
USPC ........ 375/259, 260, 267, 295, 296, 297, 299
See application file for complete search history.

(56) References Cited

U.S. PATENT DOCUMENTS

| | | | |
|---|---|---|---|
| 7,215,220 B1 | 5/2007 | Jia | |
| 8,482,462 B2 * | 7/2013 | Komijani | H04B 7/0617 342/372 |
| 2010/0117727 A1 * | 5/2010 | Dawson | H03F 1/0244 330/124 R |
| 2013/0241625 A1 * | 9/2013 | Perreault | H03F 1/0294 327/355 |
| 2014/0266465 A1 * | 9/2014 | Kermalli | H03F 1/025 330/295 |
| 2014/0267867 A1 * | 9/2014 | Lee | H04N 5/23293 348/333.01 |

OTHER PUBLICATIONS

Cheng, et al., "A 120-W X-Band Spatially Combined Solid-State Amplifier" IEE Transactions on Microwave Theory and Techniques, vol. 47 No. 12, Dec. 1999, 5 pages.

* cited by examiner

*Primary Examiner* — Siu Lee
(74) *Attorney, Agent, or Firm* — Workman Nydegger (57) ABSTRACT

Spatially combining signals may include receiving a number of RF input signals at a number of RF input connectors. At least one of the RF input signals is a variable envelope signal. A variable envelope signal is converted into two or more outphased constant envelope signals. The two or more outphased constant envelope signals are amplified. The amplified outphased constant envelope signals are radiated. At a spatial combiner aperture, the radiated amplified outphased constant envelope signals are combined to create a combined signal. The combined signal is output onto an output RF connector.

21 Claims, 5 Drawing Sheets

OUTPHASED SPATIAL COMBINER

BACKGROUND

Background and Relevant Art

When combining electromagnetic signals (such as communications, electronic warfare, radar, etc.) there are additional complexities introduced. For example, such combining typically results in an inherent peak to average power ratio (PAPR) increase created by the summing of the different signals. Additionally, these same PAPR complications can occur in single carrier waveforms under the right conditions. High-modulation order communications waveforms for example can create very large PAPR.

One such problem created by these large peak to average power ratio (PAPR) signals is the nonlinear effects produced in a Power Amplifier (PA) when operating in compression (where the amplifier is the most power efficient). Near the compression point of the PA these nonlinear effects create intermodulation distortion and other distortions to diminish waveform performance.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

One embodiment illustrated herein includes spatial combiner device, the spatial combiner device includes a plurality of Radio Frequency (RF) input connectors configured to receive input signals. The spatial combiner device further includes constant envelope circuitry coupled to one or more of the RF input connectors. The constant envelope circuitry is configured to convert a variable envelope signal into one or more constant envelope signals (typically two constant envelope signals). The spatial combiner device further includes a plurality of power amplifier circuits. Each of the power amplifier circuits in the plurality of power amplifier circuits is coupled to one of the inputs in the plurality of RF inputs. The spatial combiner device further includes a plurality of spatial radiators. Each of the spatial radiators is coupled to one of the power amplifier circuits in the plurality of power amplifier circuits. The spatial combiner device further includes a spatial combiner aperture. Each of the spatial radiators is spatially coupled to the spatial combiner aperture such that each of the spatial radiators is configured to emit signals that are received by the spatial combiner aperture. The spatial combiner device further includes an output RF connector coupled to the spatial combiner aperture. The output RF connector configured to provide an output signal. The output signal comprises a combined signal comprising a combination of amplified signals.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments illustrated herein may include a spatial combiner device. The spatial combiner device includes a plurality of Radio Frequency (RF) input connectors, such as coax or waveguide connectors, configured to receive input signals. In particular, the input connectors can receive different signals having different characteristics.

The spatial combiner device may further include a plurality of power amplifier circuits. Each of the power amplifier circuits in the plurality of power amplifier circuits is coupled to one of the inputs in the plurality of RF inputs.

The spatial combiner device may further include a plurality of spatial radiators. For example, such radiators may be antennas. Each of the radiators is coupled to one of the power amplifier circuits in the plurality of power amplifier circuits. In this way, each different input signal can be received at an individual input connector, amplified by its own amplifier circuit, and radiated by its own spatial radiator.

The spatial combiner device further includes a spatial combiner aperture, such as a receiving antenna. Each of the spatial radiators is spatially coupled to the spatial combiner aperture such that each of the spatial radiators is configured to emit signals that are received by the spatial combiner aperture. This allows different signals radiated by the spatial radiators to be combined at the spatial aperture.

The spatial combiner further includes an output RF connector, such as a coax or waveguide connector coupled to the spatial combiner aperture. The output RF connector is configured to provide an output signal. The output signal includes a combined signal comprising a combination of amplified signals received at the plurality of input RF connectors.

In some embodiments, one or more of the input connectors may be connected to constant envelope circuitry. For example, as illustrated below, the constant envelope circuitry could be outphasing circuitry used to convert a signal with a non-unity peak to average power ratio (e.g., an amplitude modulated signal) to signals with substantially constant envelope. Thus, for example, some (or all) signals input into the spatial combiner device could be outphased to convert a variable envelope input signal into one or more constant envelope signals.

Figure 1:
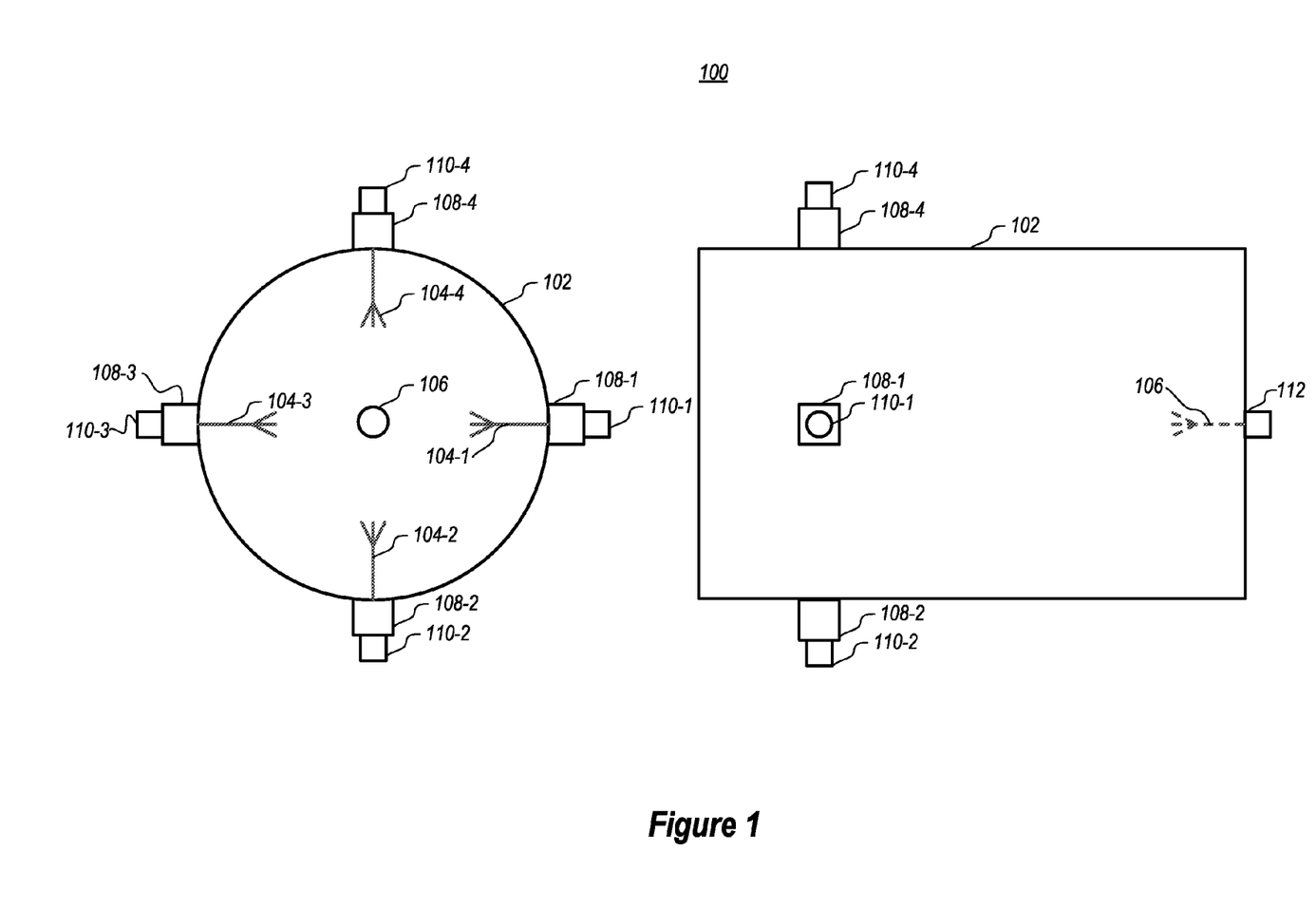
FIG. 1 illustrates a front view and a side view of a spatial combiner device.

Referring now to FIG. 1, an example is illustrated. FIG. 1 illustrates a spatial combiner device 100. The spatial combiner device 100 includes a body 102. The body 102 may be formed, for example, from a wave guide.

The spatial combiner device 100 has a plurality of spatial radiators 104-1 through 104-4 disposed within the body 102. However, it should be noted in other embodiments that the spatial radiators may be external to the body 102, or in other appropriate configurations. The spatial radiators 104-1 through 104-4 may be devices such as antennas configured to emit radio waves. While four radiators are shown in the illustrated example, it should be appreciated that the number of radiators may be larger (or smaller) than four.

The spatial combiner device 100 may further include a spatial combiner aperture 106. The spatial combiner aperture 106 is configured to receive radio waves from the spatial radiators 104-1 through 104-4. In particular, the spatial combiner aperture 106 is positioned within the spatial combiner body 102 to receive radio waves emitted by the spatial radiators 104-1 through 104-4 through the body 102. Note that in some embodiments, the spatial radiators 104-1 through 104-4 may be positioned with respect to each other and with respect to the spatial combiner aperture 106 such that each of the spatial radiators is electrically and/or magnetically equidistant from the spatial combiner aperture 106. This can be accomplished by appropriate physical spacing in some embodiments. For example, each of the spatial radiators 104-1 through 104-4 may be substantially equidistant physically from the combiner aperture 106 and from each other. Alternatively or additionally, embodiments may accomplish this electrical and/or magnetic equidistant condition by using signal processing circuitry. For example, such circuitry may change phase and/or frequency of one or more input signals.

FIG. 1 further illustrates that each of the spatial radiators 104-1 through 104-4 is coupled to each its own respective power amplifier circuit 108-1 through 108-4. Each of the power amplifier circuits 108-1 through 108-4 are configured to amplify input signals and provide the amplified input signals to the corresponding spatial radiator 104-1 through 104-4. A given power amplifier circuit 108 may include one or more of a number of different circuit components. For example, a given amplifier circuit 108 may include an amplification chain. An amplification chain may include a number of different amplifiers, such as one or more preamplifiers, variable-gain amplifiers, "mid-amplifiers", final power amplifiers, isolators and other RF components, filters etc. Additionally, a given amplifier circuit 108 may include associated circuitry such as filters, attenuators, isolators etc.

FIG. 1 further illustrates that each power amplifier circuit is coupled to an RF input connector. In particular, FIG. 1 illustrates that power amplifier circuits 108-1 through 108-4 are connected to RF input connectors 110-1 through 110-4 respectively. The RF input connectors 110-1 through 110-4 may be connectors such as coaxial connectors, waveguide connectors, or other appropriate connectors.

FIG. 1 also illustrates that the spatial combiner aperture is coupled to an RF output connector 112. The RF output connector 112 may be for example a coaxial connector, waveguide connector, or other appropriate connector.

Illustratively, the spatial combiner device 100 may be used by applying different input signals to the connectors 110-1 through 110-4. The signals will be amplified by the power amplifier circuits 108-1 through 108-4 respectively. The amplified signals will then be radiated by the spatial radiators 104-1 through 104-4. The radiated signals will be propagated through the spatial combiner device where they will be received and combined by the spatial combiner aperture 106. A combined signal 128 (see FIG. 3) is then output on the RF output connector 112 such that the combined signal can be provided to other circuitry as appropriate.

Figure 2:
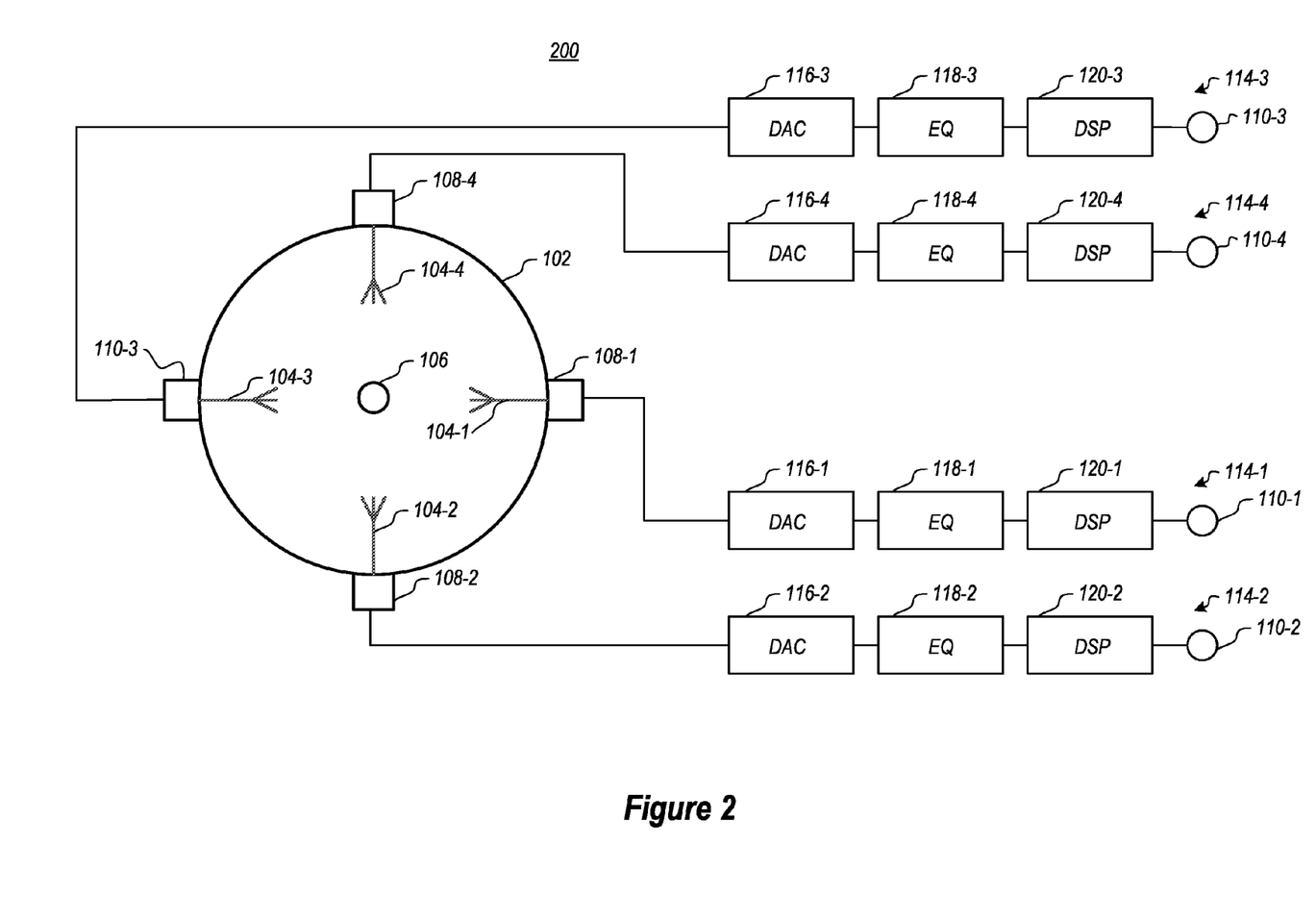
FIG. 2 illustrates an alternative example of a spatial combiner device that includes digital signal processing circuitry.

Referring now to FIG. 2, another example of a spatial combiner device 200 is illustrated where digital signal processing circuitry is included. In particular, in the example illustrated, the digital signal processing circuitry 114-1 through 114-4, such as for example digital signal processing circuitry 114-1, is included between an RF input connector, such as RF input connector 110-1, and the power amplifier circuit, such as the power amplifier circuit 108-1. The digital signal processing circuitry 114 can be used for various purposes. For example, in some embodiments, a digital signal processing circuitry can be used to adjust phase and/or frequency to ensure that input signals are properly combined by the spatial combiner aperture 106. In the example illustrated in FIG. 2, the digital signal processing circuitry 114-1 through 114-4 includes digital to analog converters 116-1 through 116-4, equalizers 118-1 through 118-6 and digital signal processors 120-1 through 120-4 respectively. The example in FIG. 2 illustrates that each of the inputs into the spatial combiner device 200 is associated with a separate digital signal processing circuit as illustrated by the digital signal processing circuits 114-1 through 114-4.

In some situations, distortions could occur if a single high PAPR signal is input into one of the power amplifier circuits 108. Many of these distortions can be mitigated using a technique called outphasing and other specialized signal processing. Outphasing divides a single high PAPR signal into two separate constant envelope signals with relative phase corresponding to the original waveform. The constant envelope signals are not significantly distorted by the power amplifier circuit 108 and other nonlinearities, allowing the power amplifier circuits 108 to operate in the most efficient compression region without impairing the waveform linearity. The original waveform envelope is recreated with the recombination of the amplified outphase signals. Equalizers and other signal processing (DSP) components alleviate other distortions that outphasing cannot.

Figure 3:
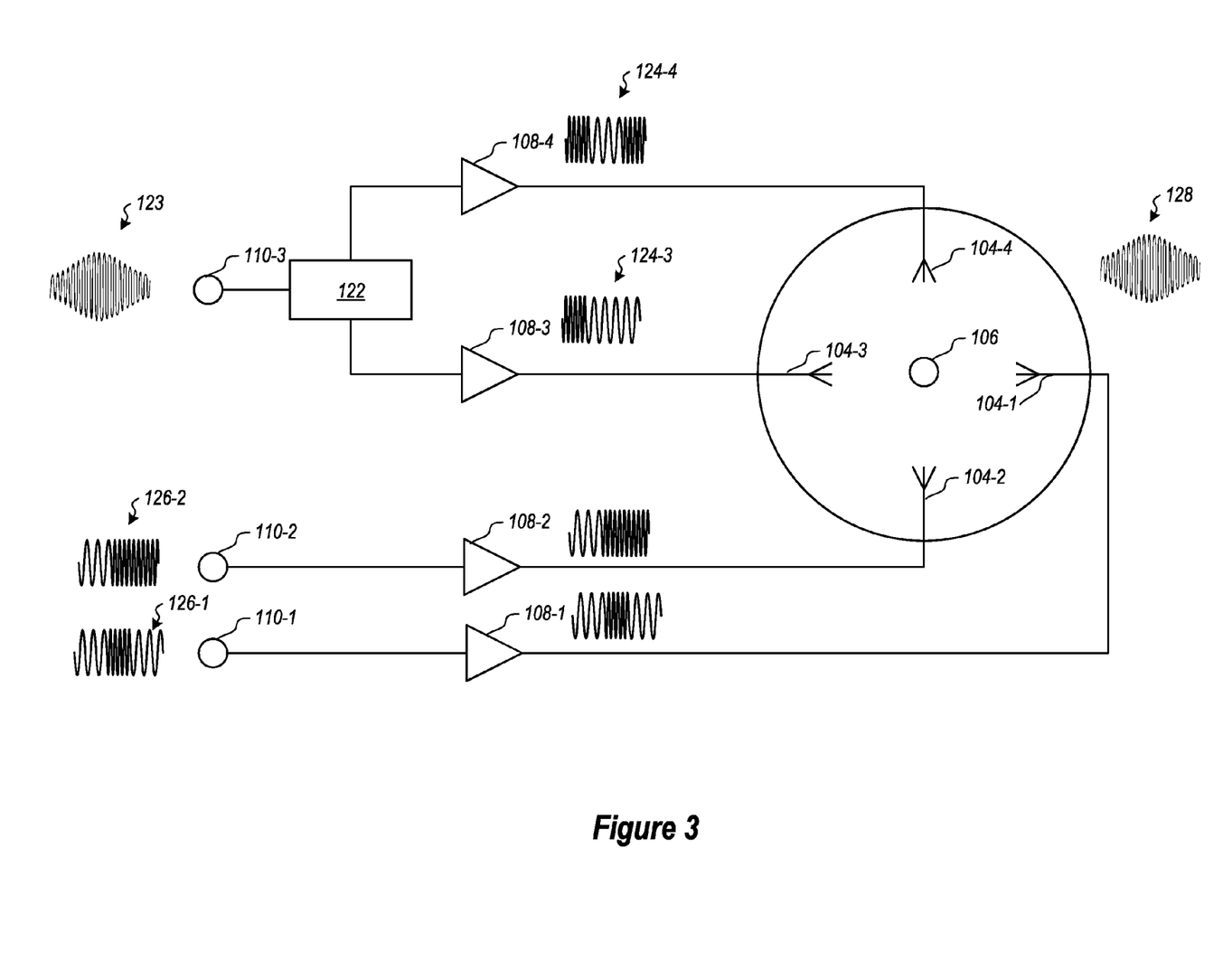
FIG. 3 illustrates an alternative example of a spatial combiner device that includes outphasing circuitry.

Reference is now made to FIG. 3 which illustrates an alternative example of a spatial combiner device 300 which includes constant envelope circuitry 122. In this example, the RF input connector 110-3 is connected to constant envelope circuitry 122. In the particular example illustrated, the constant envelope circuitry 122 can receive a high PAPR input signal 123 input at the input connector 110-3. The constant envelope circuitry 122 in this example is outphasing circuitry which divides the single high PAPR input signal 123 into two separate constant envelope signals with relative phase corresponding to the original waveform. One power amplifier circuit 108-3 amplifies the right hand of the outphasing constant envelope signal and another power amplifier circuit 108-4 amplifies the left hand side of the outphasing constant envelope signal. The amplified outphased constant envelope signals 124-3 and 124-4 are then provided to the spatial radiators 104-3 and 104-4 respectively where they are combined using TEM propagation modes in free space.

In the example illustrated, other constant envelope signals 126-1 and 126-2 can be input at the RF input connectors 110-1 and 110-2 respectively, which are then amplified by the power amplifier circuits 108-1 and 108-2. After amplification, the constant envelope signals 126-1 and 126-2 are radiated by the spatial radiators 104-1 and 104-2 respectively, such that all of the constant envelope signals 126-1, 126-2, 124-3 and 124-4 are combined and received by the spatial aperture 106, which is output as a combined signal 128 on the connector 112.

While the example in FIG. 3 illustrates some inputs coupled to constant envelope circuitry and some inputs not coupled to constant envelope circuitry, it should be appreciated that various alternatives may be implemented. For example, in some embodiments, all inputs may be coupled to circuitry configured to ensure that only constant envelope signals are provided to the power amplifier circuits. Alternatively, embodiments may be implemented where no inputs are coupled to constant envelope circuitry. Rather, the user will ensure that constant envelope signals are provided to the spatial combiner device.

Some embodiments may be implemented where a higher bandwidth signal can be created by combining different bandwidths of signals. In particular, several different constant envelope signals can be combined using the spatial combiner above.

Waveguide power combining is often required for high power signals due to insertion loss thermal dissipation of typical transmission line structures. Common TE or TM signal propagation modes for waveguide structures are efficient with low insertion loss, but are also bandwidth limited. Increasing data rate capacity of a waveform is primarily done with a combination of increasing the frequency bandwidth and increasing the amplitude peak to average ratio. In the process of signal separation of a variable envelope signal into two outphasing signals a further bandwidth expansion is experienced. Increasing waveform data rate is advantageous whether produced by wideband higher order waveforms or combining many narrow band signals.

As illustrated above, embodiments may use a spatial combiner to combine either two separate constant envelope outphased signals and/or many separate individual signals, while, in some embodiments, maintaining a relatively wide band of operation. Embodiments may be implemented where each power amplifier circuit or sets of power amplifier circuits amplify a different signal having distinct signal properties. Such properties may be different modulation, different frequency, and the like.

In one illustrative embodiment, in the case of an outphasing application, half of the power amplifier circuits amplify the right hand of an outphasing constant envelope signal and half amplify the left hand side of the outphasing constant envelope signal.

In an alternative embodiment many separate individual (constant envelope) signals, with distinct properties are amplified by a separate (or possibly more than one) power amplifier circuit, where no outphasing takes place. The signals are then combined using broadband TEM propagation modes in free space in the spatial combiner. This precludes the bandwidth limitation of common power amplifiers, and of common TE or TM modes and allows for higher power handling capability of free space combination.

As noted previously, combinations of the above may be implemented.

In any of these cases, constant envelope signals are amplified (thus avoiding the complication of non-linear distortions) and then combined using broadband TEM propagation modes in free space.

Thus, in summary, embodiments may use separate waveforms to feed the amplifiers and the amplified signals are combined in a "free space" of the spatial combiner device. Embodiments may use TEM propagation mode free space combining to create a wideband combiner for multiple signals. Because the power amplifier circuits are amplifying constant envelope signals they can run in compression and therefore with more output power and higher power efficiency from the power amplifier circuit. While running a constant envelope signal in compression, the power amplifier circuit produces less heat, reducing cooling demands and will last longer resulting in a higher Mean Time Between Failures (MTBF).

Embodiments can provide various advantages, such as reducing peak to average power problems. In particular, embodiments may be implemented where signals are less affected or not affected by the nonlinearities. Additionally or alternatively, embodiments may facilitate wider band amplification than past techniques (required in applications such as electronic warfare, high data rate communications, and efficient spectral usage/spectral dominance). Alternatively or additionally, embodiments may be implemented where a smaller occupied bandwidth is needed as compared to other combiner circuits. Alternatively or additionally, in some embodiments, power amplifier circuits do not need to be run with a back off to eliminate nonlinearity distortions. This can allow for maximum power amplifier circuit efficiency to be achieved and/or maximum power out of power amplifier circuit possible. Alternatively or additionally, freespace spatial power combing power amplifiers may run cooler. This can result in a system that requires less cooling capability. Additionally or alternatively, this can result in power amplifier circuits lasting longer.

In some embodiments, power recycling can be accomplished.

Using embodiments described herein, lower computational complexity (vs. nonlinear pre-distortion computations) may be achieved.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 4:
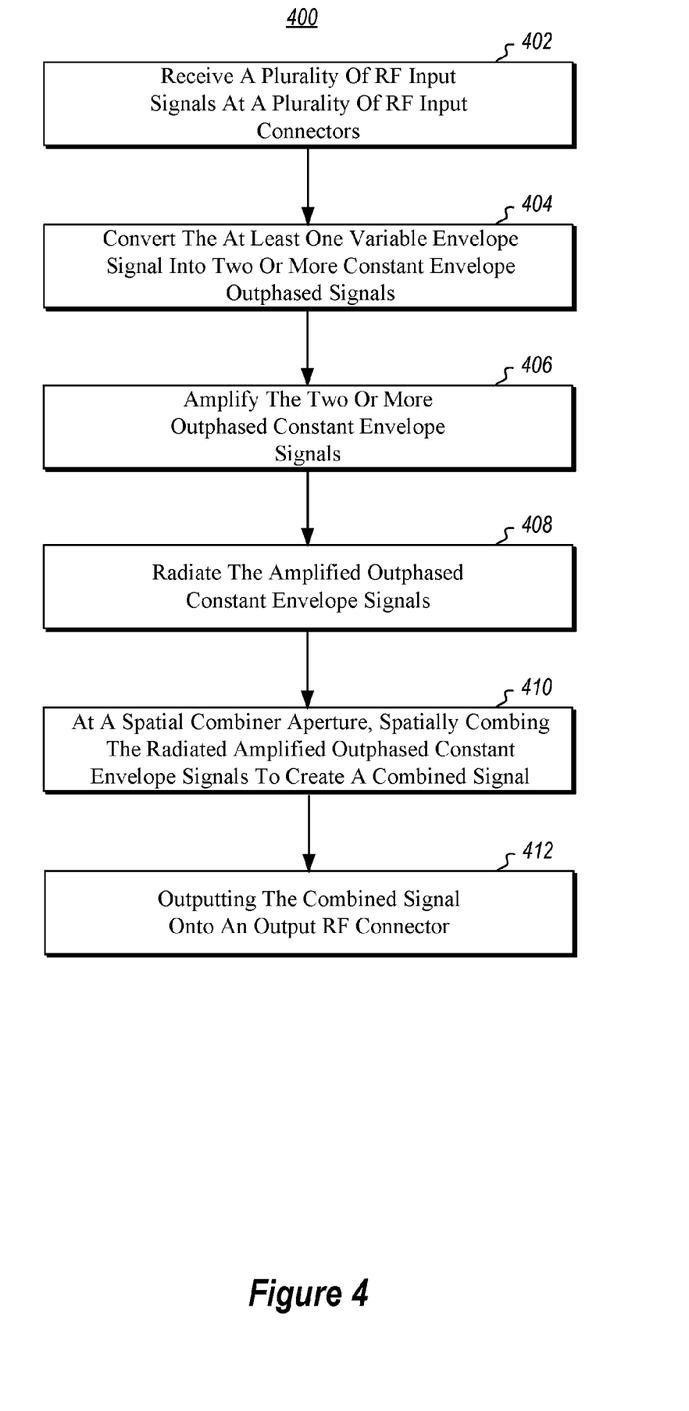
FIG. 4 illustrates a method of spatially combining signals.

Referring now to FIG. 4, a method 400 is illustrated. The method includes acts for spatially combining signals. The method includes receiving a plurality of RF input signals at a plurality of RF input connectors (act 402). At least one of the RF input signals is a variable envelope signal.

The method 400 further includes converting the at least one variable envelope signal into two or more constant envelope outphased signals (act 404). For example, as illustrated in FIG. 3, signal 123 can be outphased into outphased signals 124-3 and 124-4.

The method 400 further includes amplifying the two or more outphased constant envelope signals (act 406). For example, as illustrated in FIG. 3, the constant envelope signals 124-3 and 124-4 may be amplified.

The method 400 further includes radiating the amplified outphased constant envelope signals (act 408). For example, as illustrated in FIG. 3, the outphased constant envelope signals 124-3 and 124-4 may be radiated by the spatial radiators 104-3 and 104-4.

The method 400 further includes, at a spatial combiner aperture, spatially combing the radiated amplified outphased constant envelope signals to create a combined signal (act 410). For example, as illustrated in FIG. 3, the spatial aperture 106 may be used to spatially combine the radiated amplified outphased constant envelope signals.

The method 400 further includes outputting the combined signal onto an output RF connector (act 412). For example, as illustrated in FIG. 1, the combined signal may be output on the connector 112.

The method 400 may further include at least one of aligning, equalizing, or otherwise modifying the constant envelope outphased signals to ensure that signals received at the spatial combiner aperture are at a desired phase and/or amplitude. For example, this may be performed by the digital signal processing circuitry 114 illustrated in FIG. 2.

The method 400 may further include providing feedback based on the combined signal to digital signal processing hardware to facilitate at least one of closed loop alignment, equalization, or other calibration of the constant envelope outphased signals. For example, a signal generated at the spatial combiner 106 may be provided to the digital signal processing circuitry 104 in a feedback arrangement to allow the digital signal processing circuitry 104 to operate in a closed loop fashion.

The method 400 may be practiced where one or more of the plurality of RF signals are constant envelope input signals. In such embodiments, the method 400 may further include amplifying the constant envelope input signals, radiating the amplified constant envelope input signals and at a spatial combiner aperture, spatially combing the radiated amplified constant envelope input signals with the radiated amplified constant envelope outphased signals to create the combined signal. Thus, in this example, both outphased signals and already existing constant envelope signals can be combined together at the combiner aperture.

The method 400 may further include at least one of aligning, equalizing or otherwise processing at least one of the constant envelope input signals, the amplified constant envelope input signals, the constant envelope outphased signals, or the amplified constant envelope outphased signals to ensure that signals received at the spatial combiner aperture are at a desired phase and/or amplitude. Thus, digital signal processing circuitry 114 can be used to process the various signals.

The method 400 may be practiced where the digital signal processing hardware includes a plurality of different digital processing circuits. In such embodiments, aligning, equalizing or otherwise processing at least one of the constant envelope input signals, the amplified constant envelope input signals, the constant envelope outphased signals, or the amplified constant envelope outphased signals includes providing different input signals to different digital processing circuits. For example, FIG. 2 illustrates digital signal processing circuitry 114-1 through 114-4. Digital signal processing circuitry 114-1 can be used for one input signal, while different digital signal processing circuitry 114-2 is used for a different input signal, and so forth.

The method 400 may further include providing feedback based on the combined signal to digital signal processing hardware to facilitate at least one of closed loop alignment, equalization, or other calibration of at least one of the constant envelope input signals, the amplified constant envelope input signals, the constant envelope outphased signals, or the amplified constant envelope outphased signals.

Figure 5:
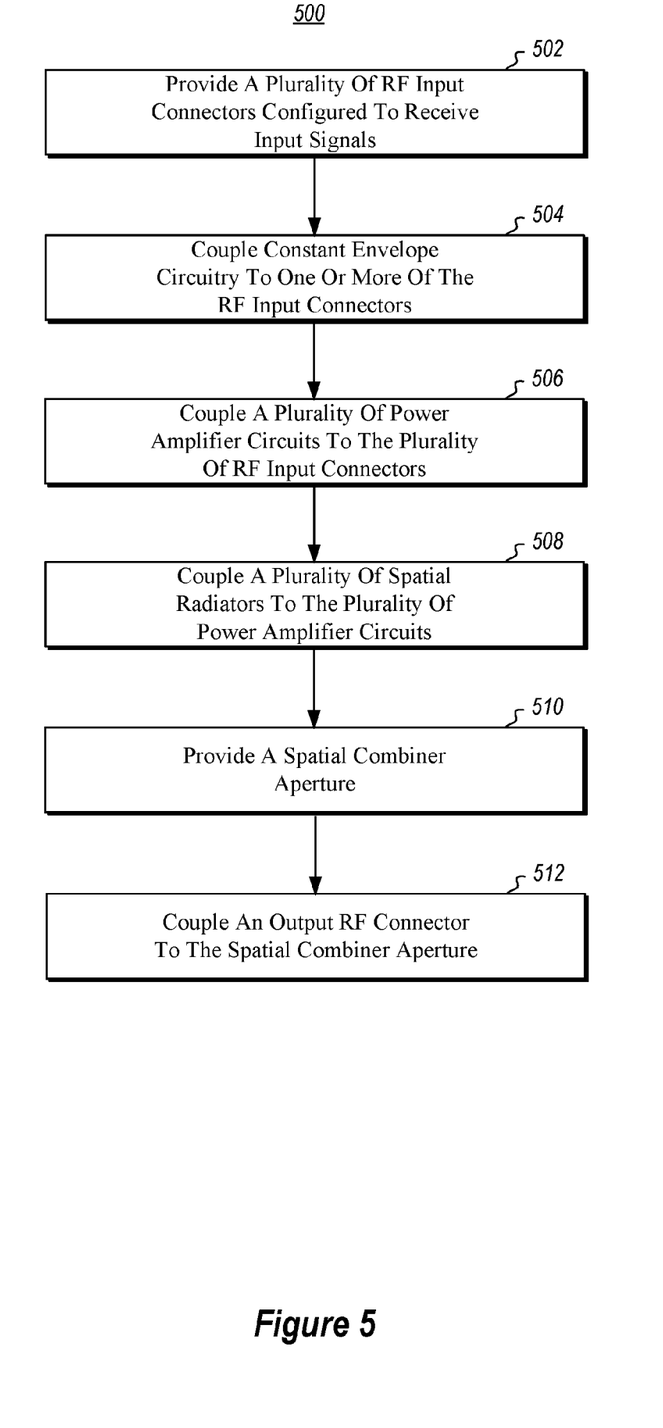
FIG. 5 illustrates a method of manufacturing a spatial combiner.

Referring now to FIG. 5, a method 500 is illustrated. The method 500 includes acts for a method of manufacturing a spatial combiner device.

The method 500 includes providing a plurality of RF input connectors configured to receive input signals (act 502).

The method 500 further includes coupling constant envelope circuitry to one or more of the RF input connectors (act 504). The constant envelope circuitry is configured to convert a variable envelope signal into one or more constant envelope signals.

The method 500 further includes coupling a plurality of power amplifier circuits to the plurality of RF input connectors (act 506). Each of the power amplifier circuits in the plurality of power amplifier circuits is coupled to one of the input connectors in the plurality of RF input connectors.

The method 500 further includes coupling a plurality of spatial radiators to the plurality of power amplifier circuits (act 508). Each of the spatial radiators in the plurality of spatial radiators is coupled to one of the power amplifier circuits in the plurality of power amplifier circuits.

The method 500 further includes providing a spatial combiner aperture (act 510). Each of the spatial radiators can be spatially coupled to the spatial combiner aperture such that each of the spatial radiators is configured to emit signals that are received by the spatial combiner aperture.

The method 500 further includes coupling an output RF connector to the spatial combiner aperture (act 512). The output RF connector is configured to provide an output signal. The output signal comprises a combined signal comprising a combination of amplified signals (act 502).

The method 500 may be practiced where the plurality of input RF connectors consists of $2^n$ connectors, wherein n is a whole number.

The method 500 may further include coupling digital signal processing hardware to the input RF connectors. The digital signal processing hardware is configured to align, equalize or otherwise modify the input signals to ensure that signals received at the spatial combiner aperture are at a desired phase and/or amplitude.

The method 500 may be practiced where the digital signal processing hardware includes feedback circuitry from the spatial combiner aperture such that the digital signal processing hardware is capable of at least one of closed loop alignment, equalization or other calibration.

The method 500 may be practiced where the digital signal processing hardware comprises a plurality of discrete sets of components and where each discrete set of components is coupled to a different input RF connector.

The method 500 may be practiced where the spatial radiators are placed essentially equidistant from the spatial combiner aperture. Although, it should be appreciated that other embodiments may engineer the distances of the spatial radiators from the spatial combiner aperture to achieve various effects.

The method 500 may further include providing a spatial cavity, where the spatial cavity is symmetrical and where the spatial radiators are disposed symmetrically about the spatial cavity. However, it should be appreciated that other configurations can be alternatively implemented to achieve various effects.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A spatial combiner device, the spatial combiner device comprising:
a plurality of RF input connectors configured to receive input signals;
constant envelope circuitry coupled to one or more of the RF input connectors, wherein the constant envelope circuitry is configured to convert a variable envelope signal into two or more constant envelope signals, but wherein at least one of the RF input connectors is not coupled to the constant envelope circuitry;
a plurality of power amplifier circuits, wherein each of the power amplifier circuits in the plurality of power amplifier circuits is coupled to one of the input connectors in the plurality of RF input connectors;
a plurality of spatial radiators, wherein each of the spatial radiators is coupled to one of the power amplifier circuits in the plurality of power amplifier circuits;
a spatial combiner aperture, wherein each of the spatial radiators is spatially coupled to the spatial combiner aperture such that each of the spatial radiators is configured to emit signals that can be received by the spatial combiner aperture, such that the spatial combiner aperture is configured to combine constant envelope signals derived from constant envelope signals input into one or more of the RF input connectors and constant envelope signals derived from variable envelope signals input into the constant envelope circuitry; and
an output RF connector coupled to the spatial combiner aperture, the output RF connector configured to provide an output signal, wherein the output signal comprises a combined signal comprising a combination of amplified signals.

2. The spatial combiner device of claim 1, wherein the plurality of input RF connectors may consist of n+1 connectors, wherein n is a whole number.

3. The spatial combiner device of claim 1, wherein the plurality of input RF connectors consists of $2^n$ connectors, wherein n is a whole number.

4. The spatial combiner device of claim 1, further comprising digital signal processing hardware coupled to the Input RF connectors, wherein the digital signal processing hardware is configured to align, equalize, calibrate or otherwise modify the input signals to ensure that signals received at the spatial combiner aperture are at a desired phase and/or amplitude and desired properties.

5. The spatial combiner device of claim 4, wherein the digital signal processing hardware comprises feedback circuitry from the spatial combiner aperture such that the digital signal processing hardware is capable of at least one of closed loop alignment, equalization or other calibration.

6. The spatial combiner device of claim 4, wherein the digital signal processing hardware comprises a plurality of discrete sets of components, wherein each discrete set of components is coupled to a different Input RF connector.

7. The spatial combiner device of claim 1, wherein the spatial radiators are essentially at least one of physically, electrically or magnetically equidistant from the spatial combiner aperture.

8. The spatial combiner device of claim 1, further comprising a spatial cavity, and wherein the spatial cavity is symmetrical and wherein the spatial radiators are disposed symmetrically about the spatial cavity.

9. A method of spatially combining signals, the method comprising:
receiving a plurality of RF input signals at a plurality of RF input connectors, wherein at least one of the RF input signals is a variable envelope signal;
converting the at least one variable envelope signal into two or more constant envelope outphased signals;
amplifying the two or more outphased constant envelope signals;
radiating the amplified outphased constant envelope signals;
receiving a one or more constant envelope RF input signals at one or more RF input connectors;
amplifying the one or more constant envelope RF input signals;
radiating the amplified one or more constant envelope RF input signals;
at a spatial combiner aperture, spatially combining the radiated amplified outphased constant envelope signals and one or more constant envelope RF input signals to create a combined signal; and
outputting the combined signal onto an output RF connector.

10. The method of claim 9, further comprising at least one of aligning, equalizing, or otherwise modifying the constant envelope outphased signals to ensure that signals received at the spatial combiner aperture are at a desired phase and/or amplitude.

11. The method of claim 10, further comprising providing feedback based on the combined signal to digital signal processing hardware to facilitate at least one of closed loop alignment, equalization, or other calibration of the constant envelope outphased signals.

12. The method of claim 11, further comprising, at digital signal processing hardware, at least one of aligning, equalizing or otherwise processing at least one of the constant envelope input signals, the amplified constant envelope input signals, the constant envelope outphased signals, or the amplified constant envelope outphased signals to ensure that signals received at the spatial combiner aperture are at a desired phase and/or amplitude.

13. The method of claim 12, wherein the digital signal processing hardware comprises a plurality of different digital processing circuits, wherein aligning, equalizing or otherwise processing at least one of the constant envelope input signals, the amplified constant envelope input signals, the constant envelope outphased signals, or the amplified constant envelope outphased signals comprises providing each different input signal to a different digital processing circuit.

14. The method of claim 11, further comprising providing feedback based on the combined signal to digital signal processing hardware to facilitate at least one of closed loop alignment, equalization, or other calibration of at least one of the constant envelope input signals, the amplified constant envelope input signals, the constant envelope outphased signals, or the amplified constant envelope outphased signals.

15. A method of manufacturing a spatial combiner device, the method comprising:
providing a plurality of RF input connectors configured to receive input signals;
coupling constant envelope circuitry to one or more of the RF input connectors, wherein the constant envelope circuitry is configured to convert a variable envelope signal into two or more constant envelope signals, but wherein at least one of the RF input connectors is not coupled to the constant envelope circuitry;

coupling a plurality of power amplifier circuits to the plurality of RF input connectors, wherein each of the power amplifier circuits in the plurality of power amplifier circuits is coupled to one of the input connectors in the plurality of RF input connectors;

coupling a plurality of spatial radiators to the plurality of power amplifier circuits, wherein each of the spatial radiators in the plurality of spatial radiators is coupled to one of the power amplifier circuits in the plurality of power amplifier circuits;

providing a spatial combiner aperture, wherein each of the spatial radiators can be spatially coupled to the spatial combiner aperture such that each of the spatial radiators is configured to emit signals that can be received by the spatial combiner aperture, such that the spatial combiner aperture is configured to combine constant envelope signals derived from constant envelope signals input into one or more of the RF input connectors and constant envelope signals derived from variable envelope signals input into the constant envelope circuitry; and coupling an output RF connector to the spatial combiner aperture, the output RF connector configured to provide an output signal, wherein the output signal comprises a combined signal comprising a combination of amplified signals.

16. The method of claim 15, wherein the plurality of input RF connectors consists of $2^n$ connectors, wherein n is a whole number.

17. The method of claim 15, further comprising coupling digital signal processing hardware to the input RF connectors, wherein the digital signal processing hardware is configured to align, equalize or otherwise modify the input signals to ensure that signals received at the spatial combiner aperture are at a desired phase and/or amplitude.

18. The method of claim 17, wherein the digital signal processing hardware comprises feedback circuitry from the spatial combiner aperture such that the digital signal processing hardware is capable of at least one of closed loop alignment, equalization or other calibration.

19. The method of claim 17, wherein the digital signal processing hardware comprises a plurality of discrete sets of components, wherein each discrete set of components is coupled to a different Input RF connector.

20. The method of claim 17, wherein the spatial radiators are essentially equidistant from the spatial combiner aperture.

21. The method of claim 17, further comprising providing a spatial cavity, and wherein the spatial cavity is symmetrical and wherein the spatial radiators are disposed symmetrically about the spatial cavity.

* * * * *